United States Patent
Bellman et al.

(10) Patent No.: US 7,459,095 B2
(45) Date of Patent: *Dec. 2, 2008

(54) OPAQUE CHROME COATING SUITABLE FOR ETCHING

(75) Inventors: Robert Bellman, Painted Post, NY (US); Ljerka Ukrainczyk, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 315 days.

This patent is subject to a terminal disclaimer.

(21) Appl. No.: 10/971,611

(22) Filed: Oct. 21, 2004

(65) Prior Publication Data

US 2006/0088688 A1    Apr. 27, 2006

(51) Int. Cl.
*B32B 3/10*    (2006.01)
(52) U.S. Cl. .......................... 216/12; 428/137
(58) Field of Classification Search ................ None
See application file for complete search history.

(56) References Cited

U.S. PATENT DOCUMENTS

| | | | | | |
|---|---|---|---|---|---|
| 4,096,026 | A | * | 6/1978 | Takeuchi | 216/12 |
| 4,139,443 | A | * | 2/1979 | Sakurai | 204/192.29 |
| 4,166,148 | A | * | 8/1979 | Sakurai | 430/5 |
| 4,203,800 | A | * | 5/1980 | Kitcher et al. | 438/714 |
| 4,363,846 | A | * | 12/1982 | Kaneki | 428/203 |
| 4,560,624 | A | * | 12/1985 | Guttner et al. | 428/632 |
| 4,675,240 | A | * | 6/1987 | Weiss | 428/846.6 |
| 4,943,486 | A | * | 7/1990 | Uchiyama | 428/469 |
| 4,963,440 | A | * | 10/1990 | Shimogori et al. | 428/651 |
| 5,230,971 | A | | 7/1993 | Alpay | |
| 5,372,901 | A | * | 12/1994 | Rolfson et al. | 430/5 |
| 5,558,711 | A | * | 9/1996 | Sakurai | 117/84 |
| 5,566,011 | A | * | 10/1996 | Steigerwald | 349/110 |
| 5,719,705 | A | * | 2/1998 | Machol | 359/581 |
| 5,780,187 | A | * | 7/1998 | Pierrat | 430/5 |
| 5,792,578 | A | * | 8/1998 | Tzu et al. | 430/5 |
| 5,808,714 | A | * | 9/1998 | Rowlands et al. | 349/110 |
| 5,976,639 | A | | 11/1999 | Iwata | |
| 6,242,136 | B1 | * | 6/2001 | Moore et al. | 430/5 |
| 6,335,142 | B1 | * | 1/2002 | Quesnel et al. | 430/275.1 |
| 6,454,910 | B1 | * | 9/2002 | Zhurin et al. | 204/192.12 |
| 6,558,855 | B2 | * | 5/2003 | Tanaka et al. | 430/5 |
| 6,852,406 | B2 | * | 2/2005 | Marechal et al. | 428/336 |
| 7,147,794 | B2 | * | 12/2006 | Gasloli | 216/75 |
| 7,160,628 | B2 | * | 1/2007 | Bellman et al. | 428/632 |

(Continued)

OTHER PUBLICATIONS

J. D. Rancort, "Optical Thin Films User Handbook", SPIE Opt. Eng. Press, Bellingham, WA (1996) pp. 126-129.

(Continued)

*Primary Examiner*—Allan Olsen
(74) *Attorney, Agent, or Firm*—Walter M. Douglas; Timothy M. Schaeberle

(57) ABSTRACT

A substrate includes an opaque chrome coating on a surface of the substrate dry-etched to form an aperture, wherein chrome in the aperture is below detectable limit. A method of forming an opaque chrome coating having at least two layers on a substrate includes depositing an initial chrome layer having a thickness of less than 10 nm on the substrate without ion-assist or with undetectable ion-assist, and then depositing the remainder of the at least two layers, with or without ion-assist, to form an opaque chrome coating.

10 Claims, 3 Drawing Sheets

U.S. PATENT DOCUMENTS

| | | | |
|---|---|---|---|
| 2002/0028392 A1* | 3/2002 | Jin et al. | 430/5 |
| 2002/0127881 A1* | 9/2002 | Xiao | 438/784 |
| 2002/0187363 A1* | 12/2002 | Chaleix et al. | 428/610 |
| 2003/0138707 A1* | 7/2003 | Dieu et al. | 430/5 |
| 2003/0186137 A1* | 10/2003 | Chan | 430/5 |
| 2003/0193719 A1* | 10/2003 | Mitsuishi et al. | 359/581 |
| 2003/0194616 A1* | 10/2003 | Carcia et al. | 430/5 |
| 2004/0099216 A1* | 5/2004 | Koh et al. | 118/723 CB |
| 2004/0159538 A1* | 8/2004 | Becker et al. | 204/192.11 |

OTHER PUBLICATIONS

P. Baumeister, "Starting designs for the computer optimization of optical coatings", Appl. Opt. 34(22) 4835 (1995).

Y. Huang, M. Buie, B. Stoehr, A. Buxbaum, and G. Ruhl, "Extended Chamber Matching and Repeatability Study for Chrome Etch," Proc. SPIE—Int. Soc. Opt. Eng., vol. 4562, pp. 624-632 (2002).

J.O. Clevenger, M.J. Buie, N.L. Sandlin, "Effect of chamber seasoning on the chrome dry etch process" Proc. SPIE—Int. Soc. Opt. Eng. vol. 5130, No. 92-100 (2003).

R. B. Anderson, G. Ruhl, N.L. Sandlin, N.L. M.J. Buie, "Study of the role of Cl2, O2, and He in the chrome etch process with optical emission spectroscopy," Proc. SPIE—Int. Soc. Opt. Eng., vol. 4889 pp. 641-652 (2002).

R.B. Anderson, G.G Ruhl, P. Nesladek, G. Prechtl, W. Sabisch, A. Kersch, M.J. Buie, "Improvement of chrome CDU by optimizing focus ring design," Proc. SPIE—Int. Soc. Opt. Eng. vol. 5130, No. 1, pp. 264-274 (2003).

M. Mueller, S. Komarov, K. Baik, "Dry Etching of Chrome for Photomasks for 100 nm Technology using Chemically Amplified Resist", *Proc. SPIE—Int. Soc. Opt. Eng.* vol. 4754, pp. 350-360 (2002).

B.Grenon, "What's wrong with Chromium as a Photomask Film," Chrome Absorber Workshop, SEMETECH, Feb. 2004.

C. Constantine, "Chrome Mask Etching: The good, the bad and the ugly," Chrome Absorber Workshop SEMETECH, Feb. 2004.

* cited by examiner

OPAQUE CHROME COATING SUITABLE FOR ETCHING

BACKGROUND OF INVENTION

Opaque chrome coating has been used for many years as a low reflectance, opaque aperture coating for optical elements, photomasks, and black matrix for LCD displays. Opaque chrome coating typically has three layers: a very thin chrome (Cr) flash for adhesion to a substrate, followed by a chrome oxide ($CrO_x$) layer for low reflection, followed by a thicker chrome (Cr) layer for opacity. The thickness and composition of the opaque chrome layers are chosen to achieve a desired opacity and low reflectance. Optimal layer composition and thickness may be experimentally determined or derived (P. Baumeister, "Starting designs for the computer optimization of optical coatings," Appl. Opt. 34(22) 4835 (1995)). Carbon and nitrogen are often added to improve the reflectance and etch resistance of some of the layers (e.g., U.S. Pat. No. 5,230,971 issued to Alpay). More complex opaque chrome coating structures are known (e.g., U.S. Pat. No. 5,976,639 issued to Iwata).

Opaque chrome coating layers are usually deposited on a substrate by a physical vapor deposition, typically thermal evaporation, e.g., electron beam evaporation or resistance evaporation, or sputtering. An aperture can be patterned in the opaque chrome coating layers with standard photolithography, either by lift-off or etch-back. Lift-off involves depositing the opaque chrome layers over the patterned resist. Stripping the photoresist in a suitable solvent removes the chrome on top the resist to form the pattern. A less critical structure can easily be patterned by lift-off. However, lift-off is less suitable for applications which require patterns with straight edges. More critical structures are typically patterned by etch-back where resist is patterned over the opaque chrome coating layers. The pattern is transferred to the opaque chrome layers by wet etching, typically with a solution of perchloric acid and cerium ammonium nitrate, or by dry etching with a chlorine and oxygen plasma. Recently, this dry etching process has been adopted in the photomask industry because it permits etching of finer features than wet etching. Dry etching of chrome has been discussed extensively in the literature (Y. Huang et al., "Extended chamber matching and repeatability study for chrome etch," Proc. SPIE—Int. Soc. Opt. Eng., Vol. 4562, pp. 624-632 (2002), J. O. Clevenger et al., "Effect of chamber seasoning on the chrome dry etch process," Proc. SPIE—Int. Soc. Opt. Eng. vol. 5130, no. 92-100 (2003), R. B. Anderson et al., "Study of the role of $Cl_2$, $O_2$, and He in the chrome etch process with optical emission spectroscopy," Proc. SPIE—Int. Soc. Opt. Eng., vol. 4889, pp. 641-652 (2002), R. B. Anderson et al., "Improvement of chrome CDU by optimizing focus ring design," Proc. SPIE—Int. Soc. Opt. Eng. vol. 5130, no. 1, pp. 264-174 (2003), and M. Mueller et al., "Dry etching of chrome for photomasks for 100 nm technology using chemically amplified resist," Proc. SPIE—Int. Soc. Opt. Eng., Vol. 4754, pp. 350-360 (2002)).

One of the most economical methods for depositing opaque chrome coating layers on a substrate is ion-assisted electron beam evaporation. In general, the method involves sequentially generating vapors of chrome (Cr) and chrome oxide ($CrO_x$) using an electron beam evaporator and depositing the vapors on a substrate while bombarding the film growing on the substrate with a low energy ion beam. The ion-assist allows for denser and more uniform films than without ion-assist. The more uniform the films, the more consistent the optical properties of the opaque chrome coating. The denser the films, the more resistant the opaque chrome coating is to cracking and pinhole formation. The ion-assist also minimizes the stress in the films. On the other hand, haze and stain of substrate in an aperture etched in opaque chrome coating layers deposited by ion-assisted electron beam evaporation have been observed. This haze and stain can affect the transmission and reflection properties of the aperture.

SUMMARY OF INVENTION

In one aspect, the invention relates to a substrate which comprises an opaque chrome coating on the substrate dry-etched to form an aperture, wherein chrome in the aperture is below detectable limit.

In another aspect, the invention relates to a method of forming an opaque chrome coating on a substrate which comprises depositing an initial thickness of the opaque chrome coating on the substrate without ion-assist or with undetectable ion-assist and depositing the remainder of the opaque chrome coating with or without ion-assist.

Other features and advantages of the invention will be apparent from the following description and the appended claims.

DETAILED DESCRIPTION OF PREFERRED EMBODIMENT

Figure 1:
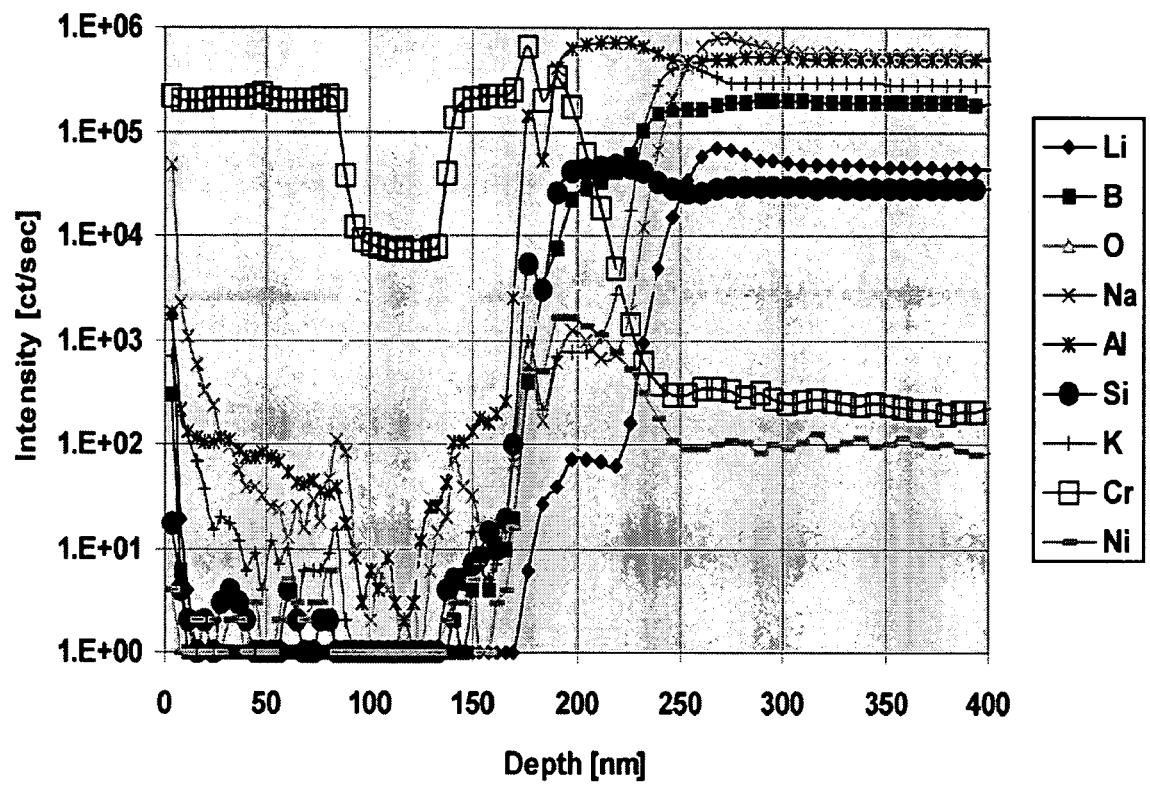
FIG. 1 is a SIMS spectra of an opaque chrome coating having first two layers deposited with ion-assisted electron beam evaporation.

In a study conducted by the inventors, an opaque chrome coating having a $Cr/CrO_x/Cr$ structure was deposited on a glass substrate using ion-assisted electron beam evaporation. The deposition rate for the first two layers was 2 A/s, and filament current at 100 V and 7A was applied to an ion gun to accelerate argon into the growing film. An aperture was formed in the opaque chrome coating layers by dry etching. However, it was discovered that dry etching could not remove all of the chrome in the aperture. Particles of chrome remained in the aperture after dry etching. The chrome particles led to haze and stain of the glass in the aperture. FIG. 1 shows a SIMS ("Secondary Ion Mass Spectroscopy") spectra for this example. The SIMS spectra show that chrome appears below the glass/opaque interface when ion-assist is used in depositing the first two layers of the opaque chrome coating.

In view of the above, the inventors have devised a method of depositing opaque chrome coating layers on a substrate such that the opaque chrome coating layers can be fully etched where desirable, leaving an etched area that is substantially free of haze and stain. The method is described below with reference to a few preferred embodiments. In the following description, numerous specific details are set forth in order to provide a thorough understanding of the invention. However, it will be apparent to one skilled in the art that the invention may be practiced without some or all of these specific details. In other instances, well-known features and/or process steps have not been described in detail in order to not unnecessarily obscure the invention. The features and advantages of the invention may be better understood with reference to the drawings and the following discussion.

Figure 2A:
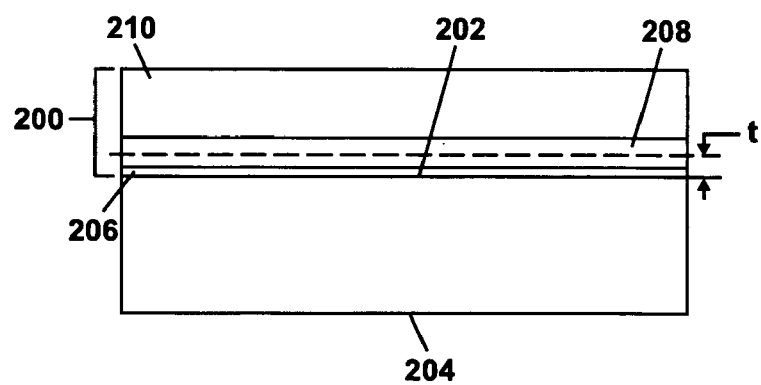
FIG. 2A shows an opaque chrome coating according to an embodiment of the invention.

FIG. 2A shows an opaque chrome coating 200 deposited on a surface 202 of a substrate 204. The substrate 204 may be made of a material that is transparent to light at the wavelengths of interest. Examples of materials for visible light applications are glass and polymer, but the invention is not limited to visible light applications. Prior to depositing the opaque chrome coating 200 on the surface 202, the surface 202 may be coated with an antireflection material and/or patterned photoresist or other desired material. Typically, the opaque chrome coating 200 includes two or more layers, each of which contains either chrome or chrome oxide. The layers may optionally contain elements such as carbon and nitrogen.

In the illustration, the opaque chrome coating 200 has a first layer 206, a second layer 208, and a third layer 210. The thickness and composition of the opaque chrome coating 200 layers may be selected such that the opaque chrome coating 200 has a desired low reflectance, opacity, and adhesion strength. The optimal thickness and composition of the opaque chrome coating 200 layers may be experimentally determined or derived. In one embodiment, the first layer 206 contains chrome (Cr) and has a chrome content greater than 50 at %, preferably greater than 70 at %, more preferably greater than 80 at % and a thickness less than 10 nm. In one embodiment, the second layer 208 contains chrome oxide ($CrO_x$) and has an oxygen content in a range from 35 to 60 at %, preferably in a range from 40 to 60 at %, more preferably in a range from 40 to 60 at % and a thickness in a range from 30 to 52 nm, preferably 34 to 49 nm. In one embodiment, the third layer 210 contains chrome and has a chrome content greater than 80 at %, preferably greater than 90 at %, and a thickness of at least 90 nm, preferably 100 nm or greater.

In accordance with an embodiment of the invention, an initial thickness (t) of the opaque chrome coating 200 is deposited without ion-assist or with undetectable ion-assist. In one embodiment, the initial thickness (t) is at least 10 nm, measured from the surface 202 of the substrate 204. Preferably, the initial thickness (t) is at least 30 nm. More preferably, the initial thickness (t) is at least 40 nm.

In one embodiment, ion assist is considered to be undetectable if the ion energies are less than or equal to about 25 V and the current density at the substrate surface 202 is less than or equal to about 0.04 $mA/cm^2$.

Depositing the initial thickness (t) of the opaque chrome coating 200 without ion-assist or with undetectable ion-assist prevents chrome from being encapsulated into the surface of the substrate 204, either due to accelerated ions forward-sputtering chrome on top the surface 202 of the substrate 204 or backward-sputtering substrate material into the chrome being deposited on the substrate 204. The remainder of the opaque chrome coating 200 can be deposited with or without ion-assist. The deposition method used in the initial thickness (t) and the remainder of the opaque chrome coating 200 can be thermal evaporation, e.g., electron beam evaporation or resistive evaporation. Resistive evaporation differs from electron beam evaporation mainly in the manner in which the vapors of coating material are generated. Using the same thermal evaporation method when depositing the initial thickness and the remainder of the opaque chrome coating 200 allows the deposition process to be completed in one vacuum process.

Figure 3:
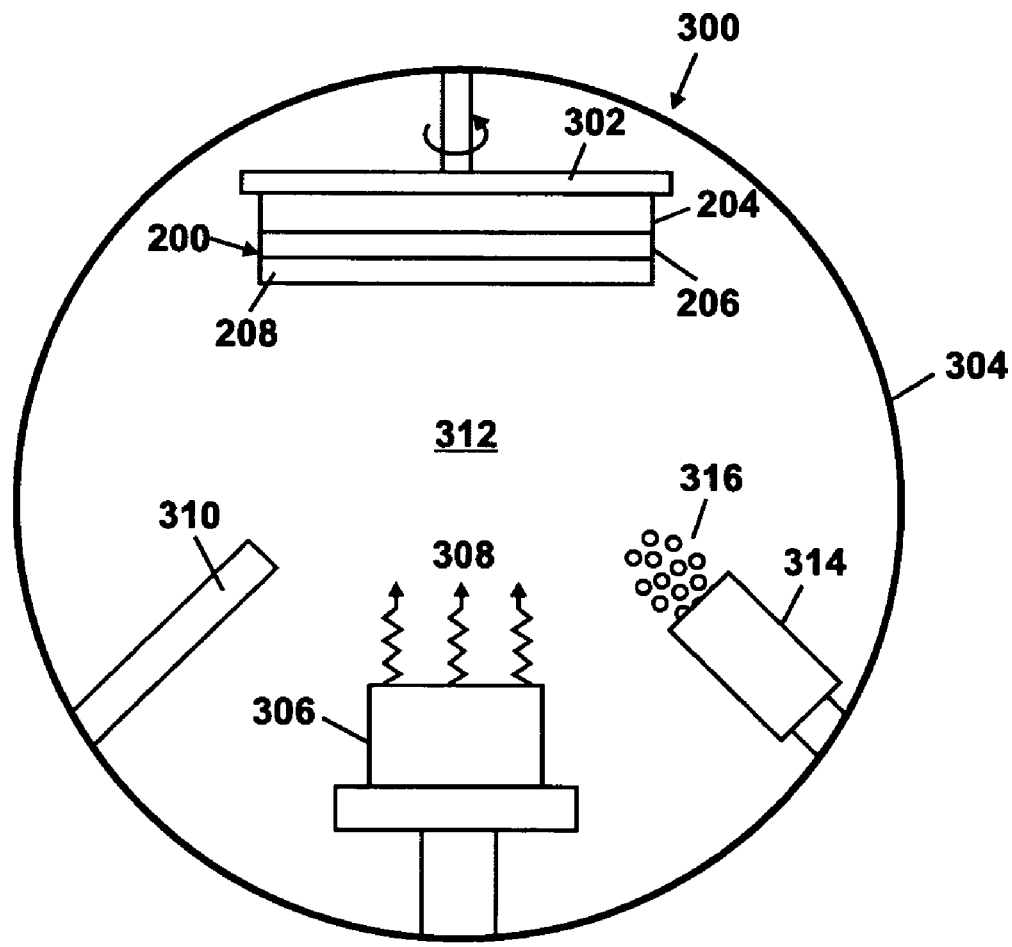
FIG. 3 illustrates a system for depositing opaque chrome coating layers on a substrate.

FIG. 3 illustrates a system 300 for forming the opaque chrome coating 200 on the substrate 204. The system 300 includes a rotatable substrate holder 302 supporting the substrate 204 in a vacuum chamber 304. Below the substrate holder 302 is an electron beam evaporator 306 that uses electron beam to generate vapors 308 from a coating material in a water-cooled crucible (not shown). The electron beam evaporator 306 could include one or more crucibles. The crucible(s) contain a material for forming the layers of the opaque chrome coating 200. The vapors are formed from one crucible at a time. A feedthrough 310 permits reactive gases to enter the chamber 312 above the electron beam evaporator 306. An oxidizing gas such as $O_2$ may be added through feedthrough 310 to react with vapors 308 to form metal oxides such as $CrO_x$. The system 300 also includes an ion source 314, which can bombard the film growing on the substrate 204 when appropriate with ions 316. Typically, the ions 316 are extracted from a plasma.

Figure 2B:
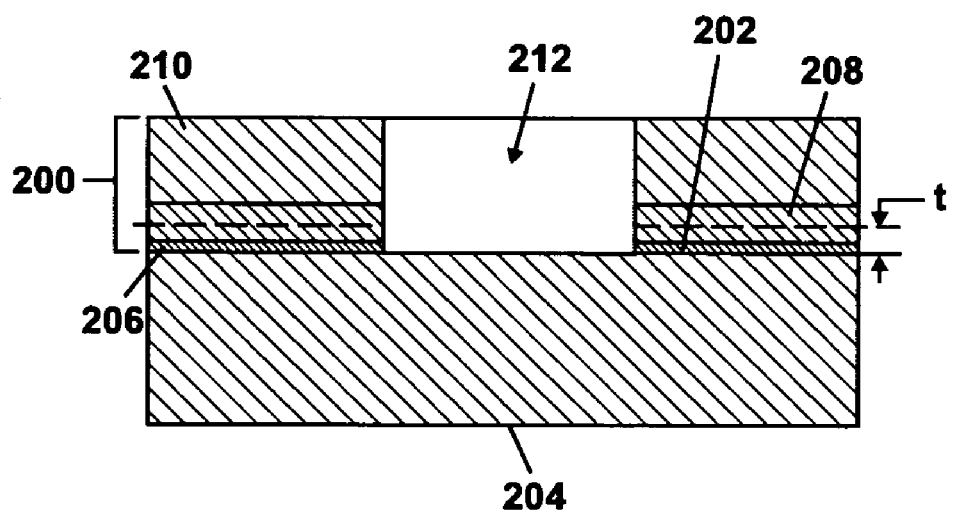
FIG. 2B shows an aperture formed in the opaque chrome coating of FIG. 2A.

FIG. 2B shows an aperture 212 formed in the opaque chrome coating 200. The aperture 212 may be formed in the opaque chrome coating 200 by photolithography. In etch-back photolithography, a photoresist is applied on the opaque chrome coating 200 and patterned with the aperture. The opaque chrome coating 200 is then etched back using the photoresist as a mask. Then, the photoresist is removed from the opaque chrome coating 200. Wet or dry etching can be used to etch-back the opaque chrome coating 200 to form the aperture 212. The etchants are typically selected such that only the opaque chrome coating 200 is etched. The wet etching can be with perchloric acid and cerium animonium nitrate solution. The dry etching is typically with oxygen and chlorine plasma. Forming an initial thickness (t) of the opaque chrome coating 200 without ion- assist or with undetectable ion-assist allows full etching of the chrome in the aperture 212. In one embodiment, chrome in the aperture 212 is below detectable limit as measured by SIMS and the substrate 204 exposed through the aperture 212 does not exhibit visible haze or stain under bright light illumination.

Figure 4A:
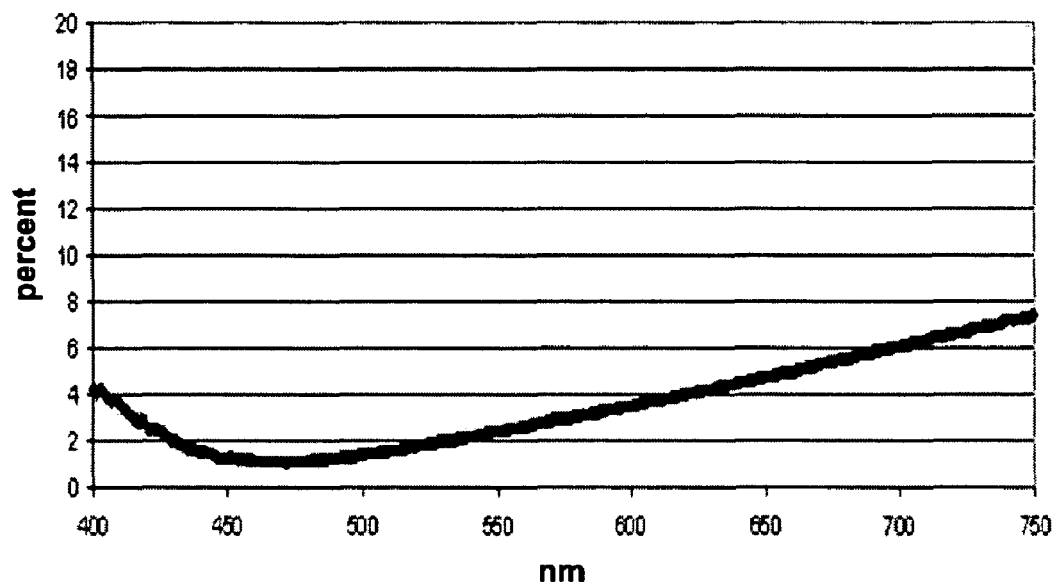
FIG. 4A shows reflectance as a function of wavelength for an opaque chrome coating according to an embodiment of the invention.
Figure 4B:
FIG. 4B shows a micrograph of an aperture etched in an opaque chrome coating according to an embodiment of the invention.
Figure 4C:
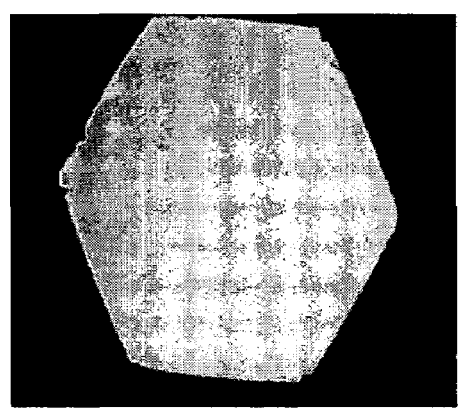
FIG. 4C shows a micrograph of the aperture having the SIMS spectra of FIG. 1.

FIG. 4A shows a reflectance versus wavelength curve for an opaque chrome coating having the structure shown in FIG. 2A. In this example, the first layer 206 contains chrome, has a thickness of 4 nm, and is deposited without ion-assist. The second layer 208 contains chrome oxide, has a thickness of 42 nm, and is deposited without ion-assist. The third layer 210 contains chrome, has a thickness of 120 nm, and is deposited with ion-assist. This produced an opaque chrome coating with an optical density of 3.8 across the visible range (400 to 700 nm). FIG. 4B shows a micrograph of an aperture etched in this opaque chrome coating. The micrograph shows that the aperture is clean after etching when no ion-assist is used in depositing the first two layers. For comparison purposes, FIG. 4C shows a micrograph of the aperture having the SIMS spectra of FIG. 1. The micrograph shows that chrome remains in the aperture when ion-assist is used in depositing the first two layers of the opaque chrome coating.

The invention typically provides the following advantages. Depositing an initial thickness (t) of the opaque chrome coating 200 without ion-assist or with undetectable ion-assist prevents chrome from being encapsulated into the surface of the substrate 204. This ensures that when the opaque chrome coating 200 is etched, substantially all of the chrome in the etched area can be removed, leaving the substrate 202 in the etched area free of haze and stain when observed under visible light illumination. Ion-assist can be used in the remainder of the opaque chrome coating 200 to achieve denser and more uniform films that are more resistant to cracking and pinhole formation and have more consistent optical properties. The same deposition method could be used for all the layers of the opaque chrome coating 200, allowing deposition to be achieved in one vacuum process, which is economical.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of forming an opaque chrome coating on a substrate, comprising:
    providing a substrate and depositing an opaque chrome coating having three layers on said substrate, said deposition being:
    depositing an initial chrome layer having a thickness less than 10 nm on the substrate without ion-assist or with undetectable ion-assist; and
    depositing one of the remaining layers of the opaque chrome coating with or without ion-assist and depositing the other one of the remaining layers of the opaque chrome coating with ion-assist to thereby form an opaque chrome coating having three layers on said substrate;
    wherein ion-assist is defined as undetectable when the ion energies are less than or equal to about 25 V and current density is less than or equal to about 0.04 mA/cm$^2$.

2. The method of claim 1, wherein the thickness of the opaque chrome coating is at least 10 nm.

3. The method of claim 1, wherein the thickness of the opaque chrome coating is at least 30 nm.

4. The method of claim 1, wherein the thickness of the opaque chrome coating is at least 40 nm.

5. The method of claim 1, wherein the coating material in each layer is selected from the group consisting of chrome and chrome oxide.

6. The method of claim 1, wherein deposition is by thermal evaporation.

7. The method of claim 1, wherein deposition is by electron beam evaporation.

8. The method of claim 1, further comprising etching an aperture in the opaque chrome coating.

9. The method of claim 1, wherein said chrome coating comprises three layers consisting of a first layer of chrome, a second of a chrome oxide layer and a third layer of chrome;
    wherein said first layer has a thickness of less than 10 nm, said second layer has a thickness in the range of 30-52 nm, and said third layer has a thickness greater than 90 nm.

10. The method of claim 9, further comprising etching an aperture in the three layer opaque chrome coating.

* * * * *